United States Patent
Amrany

[19]
[11] Patent Number: 5,898,710
[45] Date of Patent: Apr. 27, 1999

[54] IMPLIED INTERLEAVING, A FAMILY OF SYSTEMATIC INTERLEAVERS AND DEINTERLEAVERS

[75] Inventor: Daniel Amrany, Wayside, N.J.

[73] Assignee: Globespan Technologies, Inc., Red Bank, N.J.

[21] Appl. No.: 08/469,558

[22] Filed: Jun. 6, 1995

[51] Int. Cl.⁶ .................... G06F 11/10; H03M 13/12
[52] U.S. Cl. .................... 371/43.1; 371/2.1; 371/2.2; 711/157
[58] Field of Search .................... 371/37.1, 43, 45, 371/44, 38.1, 2.1, 2.2, 21.1, 39.1, 40.1, 10.1, 37.4, 37.5, 37.6; 711/157

[56] References Cited

U.S. PATENT DOCUMENTS

| | | | |
|---|---|---|---|
| 5,063,533 | 11/1991 | Erhart et al. | 711/157 |
| 5,204,876 | 4/1993 | Bruckert et al. | 375/200 X |
| 5,224,106 | 6/1993 | Weng | 371/37.4 |
| 5,537,420 | 7/1996 | Huang | 371/43 |
| 5,572,532 | 11/1996 | Fimoff et al. | 371/2.2 |
| 5,592,492 | 1/1997 | Ben-Efraim et al. | 371/2.2 |

FOREIGN PATENT DOCUMENTS

| | | | |
|---|---|---|---|
| 0 086 566 | 8/1983 | European Pat. Off. | G11B 5/09 |
| 0 202 571 | 11/1986 | European Pat. Off. | G11B 20/18 |

OTHER PUBLICATIONS

Robert G. Gallager, Information Theory and Reliable Communication, John Wiley & Sons, 1968, pp. 286–287.
A.M. Michelson and A.H. Levesque, "Error Control Techniques for Digital Communications," pp. 410–412.
Patent Abstracts of Japan, vol. 009, No. 190 (P–378), Aug. 7, 1985 & JP 60 059468 A (Nippon Denki KK), Apr. 5, 1985.
Ramsey, John L., "Realization of Optimum Interleavers," IEEE Transactions on Information Theory, vol. IT–16, No. 3, May 1, 1970, pp. 338–345, XP002010849.

*Primary Examiner*—Emmanuel L. Moise
*Attorney, Agent, or Firm*—Thomas, Kayden, Horstemeyer & Risley

[57] ABSTRACT

Apparatus that realizes a substantial advantage by employing implied interleaving to create a systematic interleaver, that can result in a superior block error rate compared to the current data interleaving techniques in which uncorrected error bursts are distributed by the deinterleaver. The disclosed principles lead to a embodiments that essentially eliminate transmitter memory regardless of the interleaving approach employed. By way of example, block interleaving (regular or random), convolutional interleaving (regular and random) and product interleaving approaches are described. In implied interleaving, all incoming data is treated as if it is pre-interleaved and transmitted directly to its destination without alteration to its sequence, and essentially without delay. Concurrently with the transmission of the data, the data is applied to apparatus that treats the data as if it had been interleaved in accordance with a selected interleaving approach and, in accordance with such treatment, redundant symbols are generated and inserted into the transmitted data stream. At the receiver, the incoming data is delayed, corrected, and the information symbols in the incoming data are delivered to the user, corrected as necessary, in the same order as the information symbols arrived at the receiver.

26 Claims, 8 Drawing Sheets

| $A_0$ | $B_6$ | $D_2$ | $C_4$ |
| --- | --- | --- | --- |
| $B_7$ | $A_1$ | $C_5$ | $D_3$ |
| $A_2$ | $B_0$ | $D_4$ | $C_6$ |
| $B_1$ | $A_3$ | $C_7$ | $D_5$ |
| $C_0$ | $D_6$ | $B_2$ | $A_4$ |
| $D_7$ | $C_1$ | $A_5$ | $B_3$ |
| $C_2$ | $D_0$ | $B_4$ | $A_6$ |
| $D_1$ | $C_3$ | $A_7$ | $B_5$ |

IMPLIED INTERLEAVING, A FAMILY OF SYSTEMATIC INTERLEAVERS AND DEINTERLEAVERS

BACKGROUND OF THE INVENTION

This invention relates to systematic interleavers and deinterleavers that are used in conjunction with error correcting coders.

Communication of signals invariably must deal with transmission of signals through noisy channels where errors are introduced. FIG. 1 presents the block diagram of a fairly sophisticated prior art arrangement for such an environment, where data is first applied to encoder 100, the encoded data is passed on to interleaver 200, the interleaved data is modulated in block 300 and the modulated data is applied to the channel. The signal provided by the channel is demodulated in block 400, deinterleaved in block 500 and decoded in block 600.

Interleaver 200 is interposed in the system in order to account for burst errors in the channel. Specifically, interleaver 200 disperses adjacent signal elements in time prior to modulation, that burst errors do not affect too many adjacent signal elements of the original uninterleaved signal. Conversely, when considering the signal coming from the channel, errors that are closely spaced in time are interspersed at the output and are, therefore, far apart from each other. The consequence of this dispersing is that decoder 600 is able to recover the data entered into encoder 100 by virtue of the error-correcting redundancy included in the signal which decoder 600 utilizes.

As is well known, modulator 300 and demodulator 400 may be subsystems that themselves include robust coding and decoding. For example, modulator 300 may include a front end section that is a trellis encoder. Correspondingly, the tail-end of demodulator 400 would include a Viterbi decoder.

SUMMARY

A substantial advantage is realized in accordance with the principles disclosed herein by employing implied interleaving. An implied interleaver is a systematic interleaver, which is one that does not alter the incoming data sequence, and as such may result in a superior block error rate, compared to the current data interleaving techniques in which uncorrected error bursts are distributed by the deinterleaver.

While in other interleaving and encoding approaches the encoding apparatus requires memory and imposes delay upon some of the transmitted signal, implied interleaving essentially dispenses with all memory and corresponding delay in the transmitter-encoder By way of example, block interleaving, convolutional interleaving, random and product interleaving approaches are described. The only memory that is needed is the one which is normally provided for the speed-up in the data rate to create room for the insertion of redundant symbols in the transmitted data stream. Concurrently with its transmission, the data is applied to apparatus that treats the data as if it had been interleaved in accordance with a selected interleaving approach. In accordance with such treatment, redundant symbols are generated and inserted into the transmitted data stream.

At the receiver, the incoming data is delayed, corrected, and the information symbols in the incoming data are delivered to the user, corrected as necessary, in the same order as the information symbols arrived at the receiver. Since the data sequence is not changed at the receiver, the decoder can operate on the data directly inside the deinterleaving memory. The errors are therefore corrected in-place, without the need for multiple data storage at the decoder input and output stages.

DETAILED DESCRIPTION

Interleaving algorithms and techniques were introduced to the art of communication in order to increase the noise immunity of systems that are subject to burst errors. Interleaving algorithms define the relations among data sequences of different codeword blocks on the transmission channel, and interleaving techniques define the implementation methods to achieve these relations. Examples of interleaving algorithms are block interleaving, and convolutional interleaving. Examples of interleaving techniques, are data interleaving and code interleaving.

Figure 1:
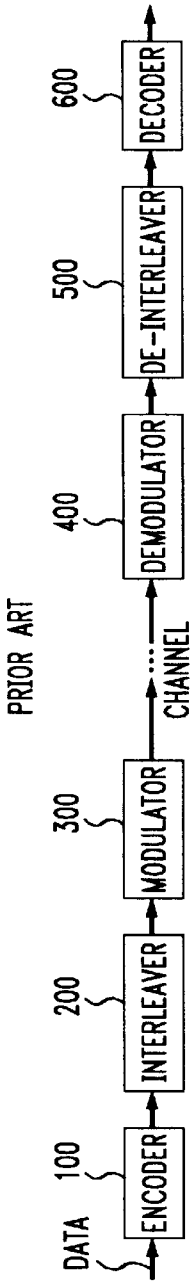
FIG. 1 shows a prior art coder/decoder arrangement with an interleaver and a deinterleaver-interleaver interposed therebetween.
Figure 2:
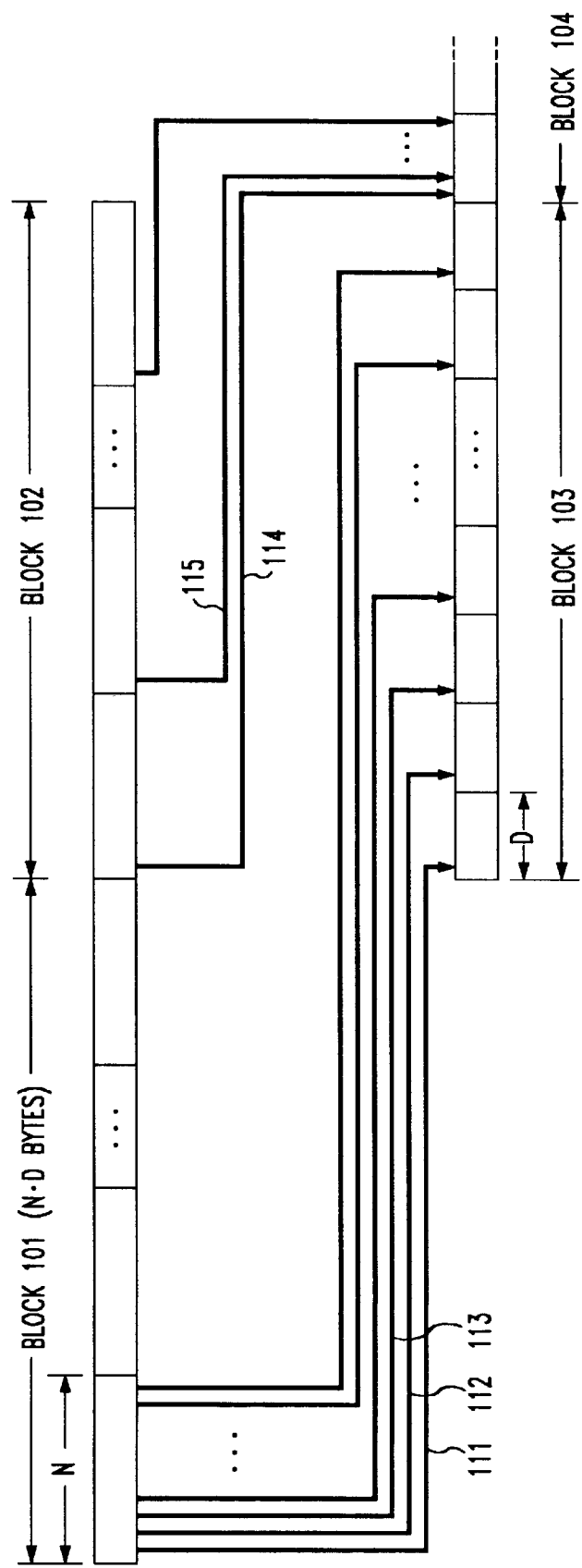
FIG. 2 illustrates block interleaving.

In data interleaving, information is first applied to an encoder, and the encoder's output is interleaved. In code interleaving (a rarely used technique), the information is interleaved first and then applied to the encoding process. This technique is described by R. G. Gallager in "Information Theory and Reliable Communication", John Wiley & Sons, 1968, pp. 286 et seq (FIG. 2). Gallager presents an Interlaced Interleaving in a block interleaved arrangement where the incoming information are gated to multiple encoders. The Interlaced Interleaving approach is an example of code interleaving where the information is interleaved first and then encoded, Gallager employs a plurality of encoders. In effect, he deinterleaves the information, routes the deinterleaved information to the encoders, and then re-interleaves the information and the redundant symbols. He has apparently not realized that data can be viewed a being pre-interleaved.

Figure 3:
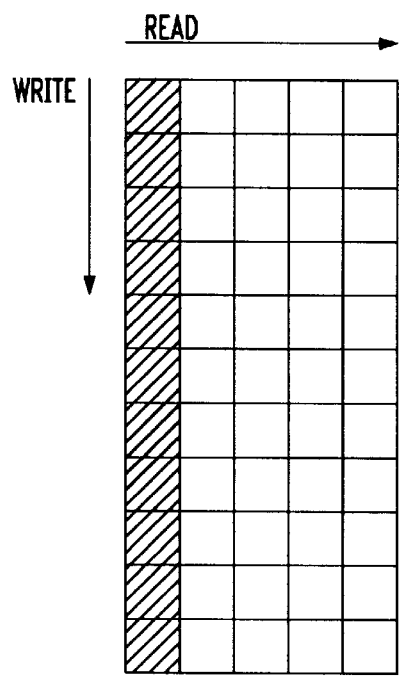
FIG. 3 presents a memory map arranged for block interleaving.

An understanding of interleaving algorithms can be gained by looking at the movement of data symbols in the time domain, as shown for example in FIG. 2, or by viewing the process of storing data in a matrix in accordance with one procedure and retrieving it in accordance with another procedure, as shown for example in FIG. 3. Both FIGS. 2 and 3 illustrate block interleaving.

In block interleaving, a block of data is rearranged to insure that consecutive symbols in the block prior to interleaving are not adjacent in the block after the interleaving. A clear characteristic of block interleaving is that the interleaved data can be separated into blocks of consecutive symbols which correspond to blocks of consecutive symbols in the uninterleaved data. The only difference between the two corresponding blocks is in the sequence of symbols in the blocks.

For illustrative purposes, FIG. 2 depicts two blocks of data, 101 and 102, each having N×D symbols. More particularly, each block includes D groups (codewords) of N symbols each. Since block interleaving rearranges the sequence of symbols, it is clear that a delay must be introduced in order to allow later arriving symbols to appear earlier in the interleaved output. To a first degree of approximation, in block encoding, the interleaved data of each block can be obtained only after the entire block of data has arrived. This is depicted by blocks 103 and 104 in FIG. 2, which correspond to the interleaved data of blocks 101 and 102, respectively. The interleaving of data is accomplished by taking consecutive symbols of each codeword, and dispersing them at intervals of D symbols in blocks 103 and 104 (the value of D being the interleaving depth). Thus, the 1st symbol of the first codeword in block 101 (line 111) becomes the 1st symbol of codeword 103, the 2nd symbol of the first codeword of block 101 (line 112) is moved to be the $(D+1)^{th}$ symbol of codeword 103, the third symbol of the first codeword of block 101 (line 113) is moved to be the $(2D+1)^{th}$ symbol of codeword 103, etc.

In the same interleaving procedure, but viewed another way, the first symbol of the 1st codeword in block 102 (line 114) becomes the first symbol of codeword 104, the first symbol of the 2nd codeword in block 102 (line 115) is moved to be the 2nd symbol of codeword 104, etc.

If the data of block 101 is written into successive cells of a storage element, then the above-described interleaving can be realized by simply reading data out in jumps of D cells. If the storage element is viewed as a matrix, as depicted in FIG. 3, and data is written into the matrix a column at a time, where each column contains a number of cells equal to the number of symbols in a codeword, then each codeword occupies a column (see shaded area in the first column) and the above-described interleaving is realized by reading data out of the matrix, a row at a time.

As indicated above, the interleaving described in connection with FIGS. 2 and 3 is block interleaving, where one can identify a block of input data and a corresponding block of output data. The output block contains only the data of the input block.

In convolutional interleaving, no output block of contiguous data signals can be found that corresponds to an input block of data, in the sense of containing only the data of the input block.

Figure 4:
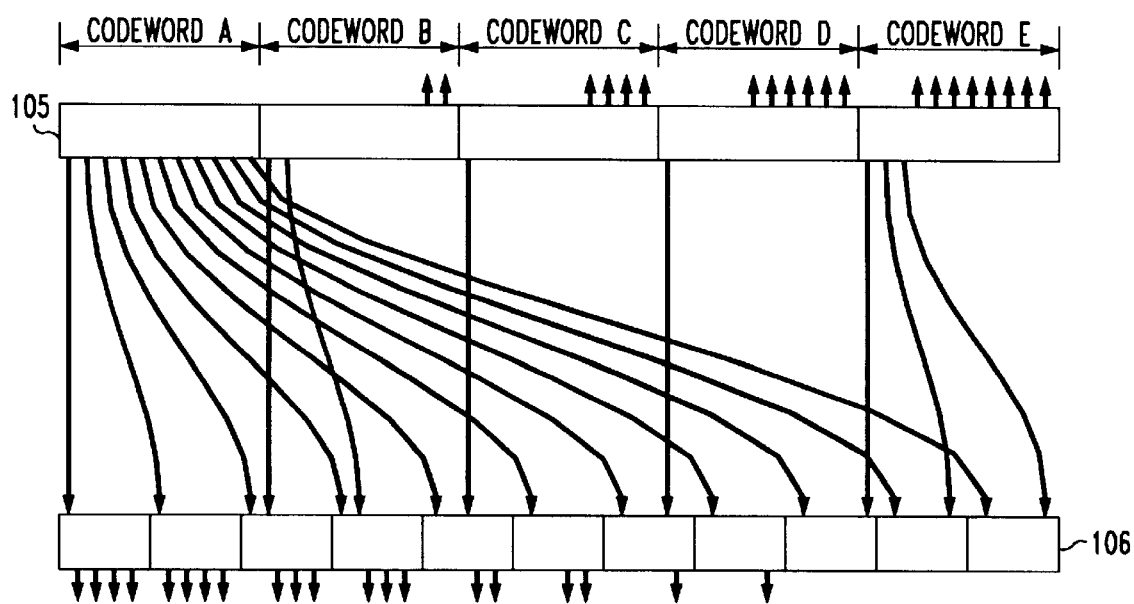
FIG. 4 illustrates convolutional interleaving.

A convolutional interleaving arrangement is depicted in FIG. 4, where the codeword length, N, is 11 symbols and the interleaving depth, D, is 5. It may be said that input block 105 supplies data to an interleaved output symbol sequence 106 of length N×D, but it supplies only some of the symbols for sequence 106, and it also supplies data to a following symbol sequence. The latter data is illustrated by the 20 (short) up-arrows in block 105. Correspondingly, sequence 106 receives symbols from the block that is previous to block 105, and that data is illustrated by the 20 (short) down-arrows in sequence 106.

Figure 5:
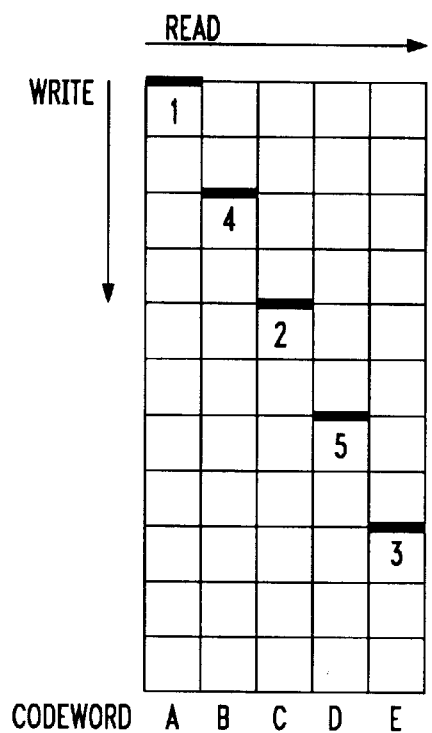
FIG. 5 presents a memory map for a convolutional code where codewords are of length 11 and the interleaving depth is 5.

FIG. 5 is a matrix representation of the FIG. 4 interleaving, and it contains 11 rows and 5 columns. Following the teachings of Aslanis et al in "A Selective Error Correction Proposal for ADSL", ANSI Contribution T1E1.4/93-023, Mar. 8, 1993, if the codewords A through E of FIG. 4 are written in columns as depicted in FIG. 5, then data that is read out from the matrix a row at a time yields the convolutional interleaving of FIG. 4. More specifically, for an arrangement where N=11 and D=5, if data is written a column at a time, with each successive codeword being generally staggered by 2 rows (codeword 0 starting at row 0, and each codeword i starting at row 2i), then a straight reading-out by rows results in an interleaved output.

A number of attributes should be noted in connection with the storage of data in a matrix, and the teaching of Aslanis et al.

1) Aslanis et al state that N and D must be co-prime in order for this arrangement to work; although they recognize that when N and D are not co-prime dummy symbols can create a co-prime relationship. However, the data at the interleaver output is NOT uniformly distributed. One gets $K^*(N/D)$ of symbols with a spacing of D and then one gets a symbol with a spacing of D+1 (K is the largest common divisor). The total system delay is increased by D/K symbols.

Figure 6:
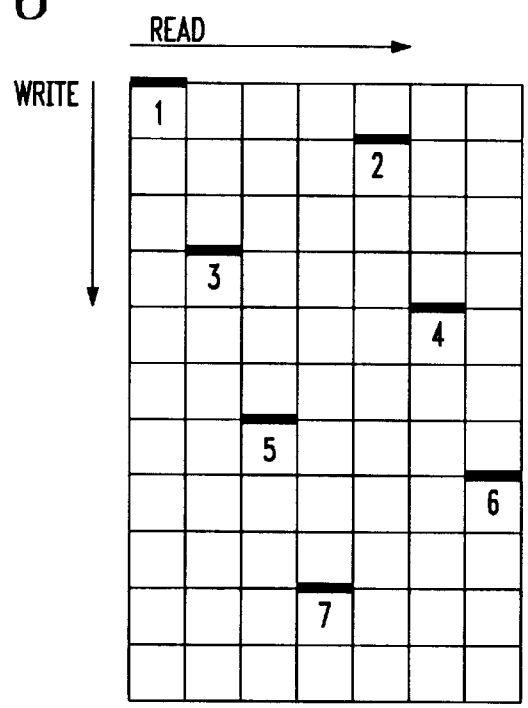
FIG. 6 presents a memory map for a convolutional code where codewords are of length 11 and the interleaving depth is 7.

2) Different sets of N and D values will result in different staggering in rows and columns. Thus, for example, codewords that are adjacent in the input data stream may not be in adjacent columns of the matrix. This is illustrated in FIG. 6, where N=11 and D=7.

3) Aslanis et al believed that both block interleaving and convolutional interleaving require an interleaving memory of N×D symbols.

4) In the convolutional interleaving described by Aslanis et al and the associated storing of data in the matrix, the first symbol in each codeword experiences no delay. The data is written and then read-out immediately thereafter. Other symbols, however, incur a delay that varies with the symbol position in the codeword. On the receiver side the deinterleaved data is again delayed by different amounts with the total delay being equal across all data symbols.

Effectively zero uniform delay can be achieved by assuming that the data to be transmitted is actually the interleaved result of some other imagined data to which an interleaving algorithm had been applied. With such an assumption, any interleaving algorithm can be assumed to have been applied to this imagined data, with essentially no associated increase in the complexity of the encoder or decoder. Stated in other words, if the data comes already interleaved, the memories into which the data is inserted in accordance with the depictions of FIGS. 5 and 6 are not needed.

With the available data already "interleaved", all that remains to be done is to encode the data and transmit it. This leads to the implied interleaving concept, with its systematic characteristic, for all types of interleaving algorithms not just block interleaving.

In applications where the encoding comprises merely the addition of a number of redundant, error correcting symbols/ symbols, a rate conversion must be executed to provide the time slots in which the redundant symbols are kept, and that requires some minimal amount of memory. The redundant error correcting symbols are symbols that are associated with a group of consecutive signals in the uninterleaved data. This memory is normally needed at each encoder and distributed over the multiple encoders. By combining all distributed small buffers into a single one at the data input, additional reduction in total rate conversion memory is achieved where the combined memory can be as small as one of the small buffers at one of the encoder inputs. Effectively reducing the memory by another factor D.

Figure 9:
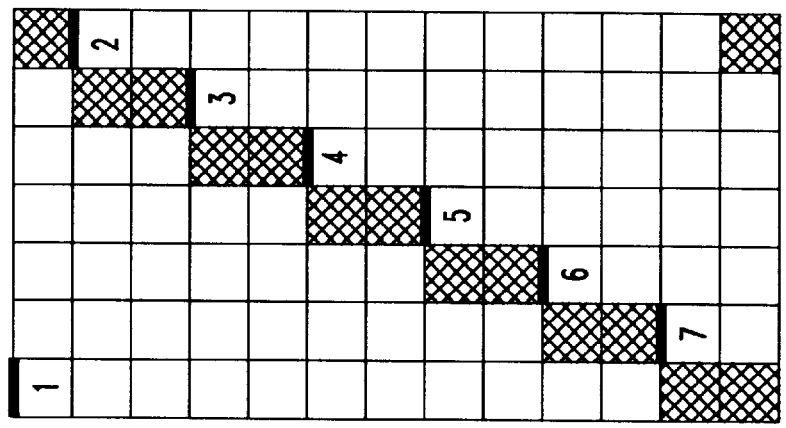
FIGS. 7–9 correspond to FIGS. 3, 5, and 6, with the redundant symbols shown.
Figure 8:
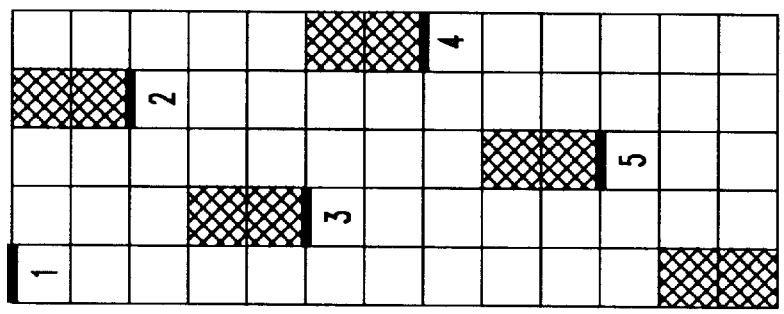
Figure 7:
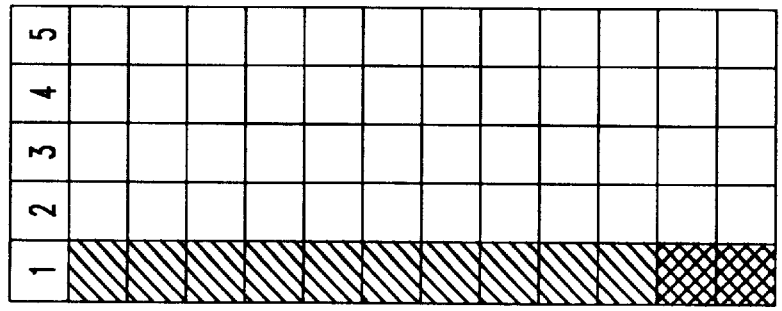

If the matrix arrangements of FIGS. 3, 5 and 6 were viewed the with 2 error correcting symbols added to each codeword, the result would be as presented in FIGS. 7, 8 and 9, respectively. It may be noted that, with the particular interleaving that was implied, the positions of the codewords in columns of the matrices are different from those in FIGS. 3, 5 and 6. The cells containing numbers (1,2,3,4 and 5) designate the cells where the codewords start, and the cross-hatched cells are the cells that contain the error correcting symbols. To reiterate, however, when the data comes in already interleaved, the arrangements of FIGS. 7–9 as well as FIGS. 5–6 do not represent needed memory, but are shown merely to assist in understanding the invention. Compared with Aslanis et al:

1) N and D can be of any ratio and the data can be uniformly distributed, based only on designer's choice;
2) The staggering in rows and colunms to different sets of N and D values and are the sole choice of the designer;
3) Both block interleaving and convolutional interleaving require no transmit delay;
4) All symbols incur a zero delay, regardless of their position in the code word; and
5) Multiple channels with different encoders and interleaving depth can be interleaved in the same circuit. Moreover, there are multiple encoder architectures that can be employed within the scope of the principles disclosed herein. One can have an architecture that is similar to that of Gallager (with appropriate added controllers), one can have an architecture that includes a buffer at the common input, buffer in the data path and in the encoders, multiple buffers at the input to allow multiple channels, buffer at the output instead of at the input, or an architecture where all memory needs are met with a single RAM and an ALU with an associated controller.

Figure 10:
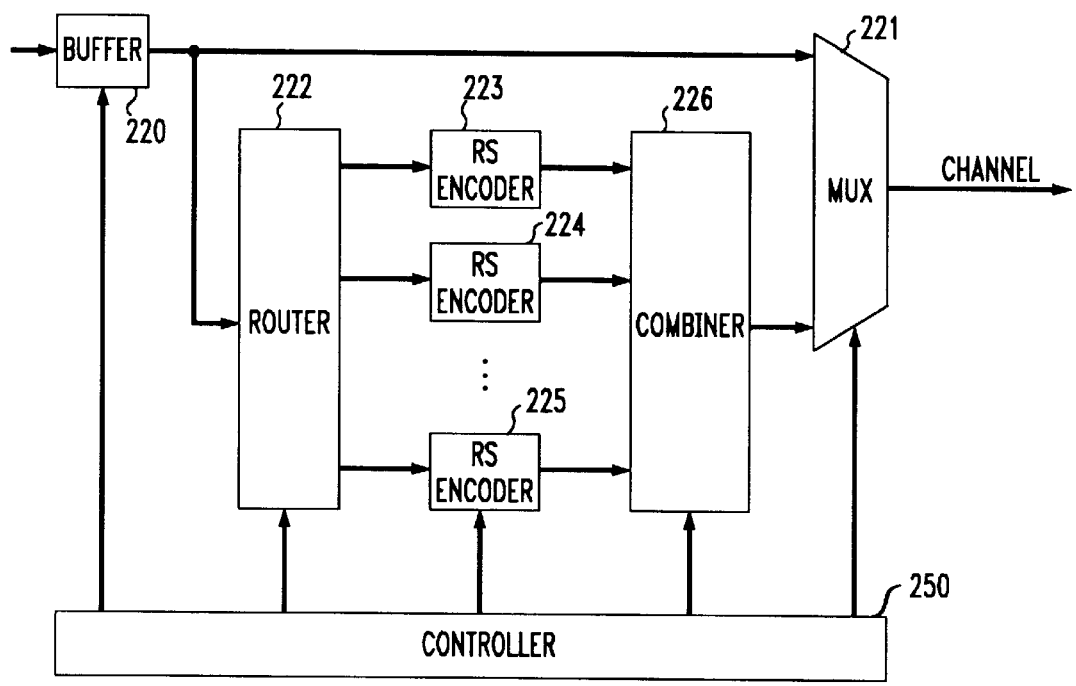
FIG. 10 is a block diagram of one realization of an encoder following the principles disclosed herein.

A data transmitting module in accordance with the principles disclosed herein is depicted in FIG. 10 with Reed Solomon encoding. Specifically, FIG. 10 includes a small FIFO buffer 220 whose output is transmitted to channel 10 via multiplexer 221. The output of buffer 220 is also applied to a router 222 which feeds a number of RS (Reed Solomon) encoders equal to the interleaving depth, D, of which encoders 223, 224, 225 are shown. The encoders develop error correction symbols and, at the appropriate times, those symbols are transmitted to channel 10 via combiner 226 and multiplexer 221. Buffer 220 provides the buffer necessary for rate conversion. The amount of memory is dependent on the specifics of N and D, as well as on the nature of the assumed interleaving algorithm. Thus, for the block interleaving of FIG. 7, for example, while the last two rows of the matrix (the error correcting symbols) are applied to the communication channel, all incoming data symbols must be buffered. While the 10 error correcting symbols of the FIG. 7 arrangement are applied to channel 10 (and all form a single uninterrupted sequence when read out from the matrix), there are (10×55)/65 symbols that arrive which must be buffered. Hence buffer 220 requires ten symbols of storage. In the convolutional interleaving of FIGS. 8 and 9, on the other hand, the longest sequence of error correcting symbols applied to channel 10 is 1 in FIG. 8 and 2 in FIG. 9. Hence, buffer 220 requires only a minimal number of storage symbols, a single symbol of storage or two, respectively. Viewed another way, the buffer needs to contain enough information so, that while symbols are inserted at one rate and extracted at a higher rate, the buffer will not fail to contain symbols when symbols needs to be extracted. This leads to the relationship that the buffer needs to be as large as $N[(T_o/T_i)-1]$ raised to the next integer, where N is the largest block of extracted symbols between redundant symbols, and $T_o$ and $T_i$ are the output and input rates, respectively.

Elements 222 and 226 are obviously affected by the interleaving algorithm that is assumed to have been applied to the "interleaved" data. Multiplexer 221 needs to know when the data symbols are communicated from buffer 220 and when the error correcting symbols are communicated from combiner 226, and router 222 needs to know where to route the data symbols, in accordance with the assumed, or implied, interleaving.

For example, if it is assumed that the incoming data has been block interleaved in accordance with FIG. 7, the symbol corresponding to the cell in the first row and the first column is designated to be the first symbol of the first codeword, and accordingly, it is routed by element 222 to an RS encoder (e.g., encoder 223) that had been reset immediately prior to the arrival of that symbol. The next symbol, designated to be the first symbol of the second codeword, is routed by element 222 to a second RS encoder (e.g., encoder 224) that had been reset immediately prior to the arrival of that symbol; and the same treatment is applied to the remaining three symbols. According to FIG. 7, after channel 10 receives 55 symbols from buffer 220 via multiplexer 221 (and at that time the same 55 symbols are applied to RS encoders 223–225 via router 222, the channel receives the next 10 symbols from the RS encoders via combiner 226 and multiplexer 221. It may be noted in passing that combiner 226 and multiplexer 221 can be implemented in a single combiner, but it is shown here as two elements to make the description clearer.

In light of the above example, one can view the sequencing as being divided into two segments: a 55 symbol "data symbols" segment and a 10 symbol "error correcting symbols" segment. During the data symbols segment router 222 sequentially cycles through 5 RS encoders, and during the first 5 symbols of the data segment each RS encoder to which data is routed is reset prior to the application of the data symbol. During the data symbols segment, multiplexer 221 is set to pass the data out of buffer 220 to channel 10, and the actions of combiner 226 are irrelevant. During the error correction symbols segment, no data is entered into the encoders by router 222, multiplexer 221 is set to pass the output signal of combiner 226 to channel 10, and combiner 226 cycles twice through the five RS encoders and delivers their error encoding symbols to channel 10. Data that arrives at that time is stored in buffer 220.

The principle is the same for data that is assumed to have been interleaved in accordance with the illustration in FIG. 8, but the specific sequencing is different. The table below illustrates the actions in connection with the first 17 symbols for the arrangement corresponding to FIG. 8.

| symbol | router 221 | combiner 226 |
|---|---|---|
| 1 | reset encoder 1 & apply data to encoder 1 | — |
| 2 | apply data to encoder 3 | — |
| 3 | apply data to encoder 5 | — |
| 4 | — | output error correcting symbol from encoder 2 |
| 5 | apply data to encoder 4 | — |
| 6 | apply data to encoder 1 | — |
| 7 | apply data to encoder 3 | — |
| 8 | apply data to encoder 5 | — |
| 9 | — | output error correcting symbol from encoder 2 |
| 10 | apply data to encoder 4 | — |
| 11 | apply data to encoder 1 | — |
| 12 | apply data to encoder 3 | — |
| 13 | apply data to encoder 5 | — |
| 14 | reset encoder 2 & apply data to encoder | — |
| 15 | apply data to encoder 4 | — |
| 16 | apply data to encoder 1 | — |
| 17 | — | output error correcting symbol from encoder 3 |

It may be noted that the cell where encoder 2 is reset is determined, for example, by designer's choice, by advancing 13 cells (the length of the codeword with the 2 error correcting symbols) from the point where encoder 1 is reset. The same applies for the resetting of all other encoders.

The actual control is exercised by controller block 250. The specific circuitry within block 250 (counters, shift registers and some combinatorial logic) is not presented here because it is perfectly conventional and because it will depend on the particular interleaving schema that is implied, or presumed. The important thing to note, however, is that the FIG. 10 arrangement is general enough to handle block interleaving, convolutional interleaving (as disclosed above) and product encoding that could combine, for example, block interleaved and convolutionally interleaved data (as disclosed below).

The following presents an arrangement of a implied convolutional interleaving of symbol length and an interleaving depth of 30.

$C_{m,119}, C_{m-1,115}, C_{m-2,111}, \ldots C_{m-28,7}, C_{m-29,3},$
$C_{m,118}, C_{m-1,114}, C_{m-2,110}, \ldots C_{m-28,6}, C_{m-29,2},$
$C_{m,117}, C_{m-1,113}, C_{m-2,109}, \ldots C_{m-28,5}, C_{m-29,1},$
$C_{m,116}, C_{m-1,112}, C_{m-2,108}, \ldots C_{m-28,4}, C_{m-29,0},$
$C_{m,115}, C_{m-1,111}, C_{m-2,107}, \ldots C_{m-28,3}, C_{m+1,119},$
$C_{m,114}, C_{m-1,110}, C_{m-2,106}, \ldots C_{m-28,2}, C_{m+1,118},$
$C_{m,113}, C_{m-1,109}, C_{m-2,105}, \ldots C_{m-28,1}, C_{m+1,117},$
$C_{m,112}, C_{m-1,108}, C_{m-2,104}, \ldots C_{m-28,0}, C_{m+1,116}, \ldots$ The signals of the first column are routed by element 222 to a first encoder (223), the signals of the second columns are routed to a second encoder (224), and so on. Elements $C_{m-29,3}$ through $C_{m-29,0}$ are the redundancy symbols. Viewed another way, each set of D consecutive symbols is distributed among D encoders, and every $(D+1)^{th}$ symbol is applied to the same encoder.

Figure 12:
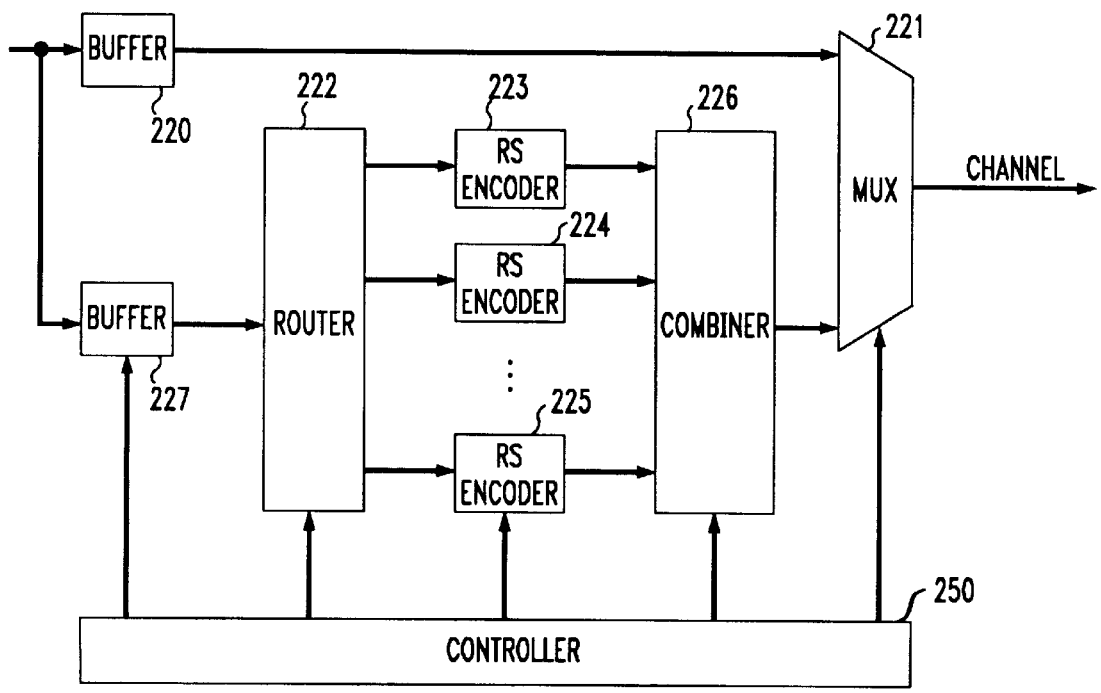
FIGS. 11–12 are other embodiments of the principles disclosed herein.
Figure 11:
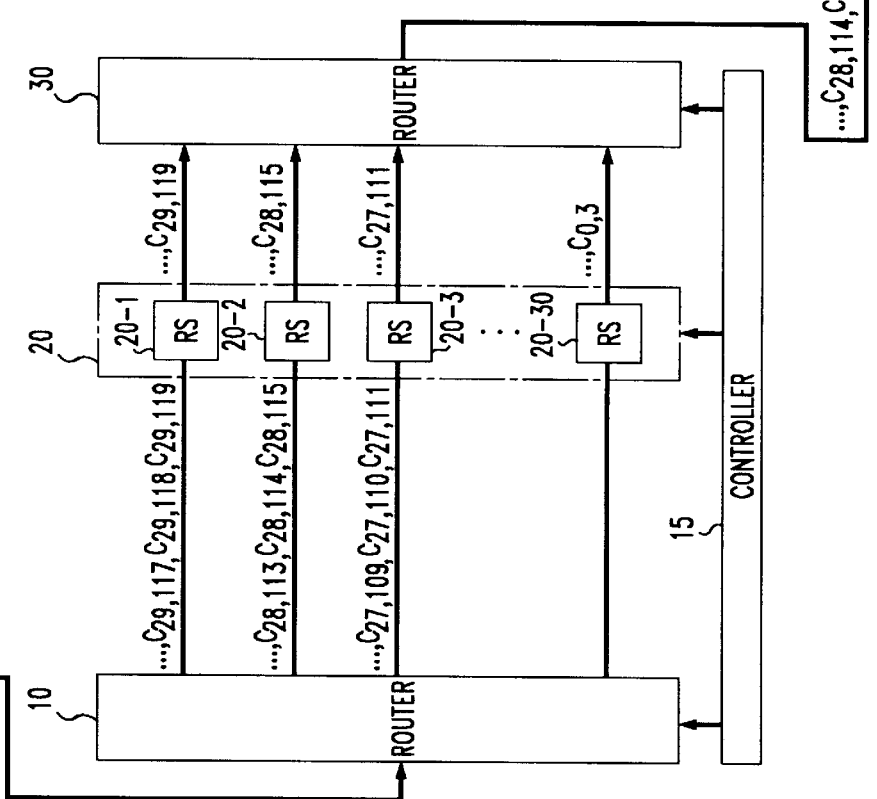

FIG. 11 presents a somewhat different encoder architecture, where the memory of buffer 220 is embedded in the encoders and the data as well as the redundant symbols are provided by the encoders. It is shown for the convolutional arrangement presented above with 120-symbol codewords and an interleaving depth of 30. FIG. 12 presents still another architecture, where a separate buffer is used for the data path and the encoding path, allowing more complex encoding structure.

At the receiver end, the arriving data can be utilized immediately, if desired, because it arrives in the same order that it had been generated by whatever equipment created the data that had been applied to buffer 220 in the transmitter. If the error correction codes are to be utilized, then the data must first be evaluated whether a transmission error occurred. Conceptually, the decoding can be done essentially in the very same manner as the error correcting symbols were generated in the transmitter of FIGS. 10–12. That is, the data can be routed to a collection of RS decoders, error correcting symbols can be generated and then used to evaluate the need to correct symbols that arrive from the transmitter. Thereafter, additional processing must be carried out to correct errors, if any, and finally, the corrected data can be delivered to its ultimate user. That means, of course, that the arriving data must be delayed (and maintained) prior to its delivery to the ultimate user until the error correction processing is accomplished; ergo, a memory is needed. More specifically, the amount of memory needed is equal to that which is sufficient to store the entire codeword, and to store newly arriving information while the codeword is evaluated and corrected.

In the arrangement of FIG. 7, for example, the implied interleaving is block interleaving and the evaluation and correction cannot start until all data is in (at the end of the 11th row in FIG. 7). The evaluation of all 5 codewords starts in the 12th row, and all 5 codewords must, then, be evaluated concurrently. If the equipment that can evaluate and correct the 5 codewords takes, for example, 6 symbols periods per codeword, or 30 symbol periods, then the total memory required is 65 symbols to store the 5 codewords and 30 symbols to store the incoming data during the correction phase; for a total of 95 symbols, or D(N+L), where L is the number of symbols necessary to correct a codeword. (As an aside, the element that carries out the calculations necessary to correct transmission errors is not limited to operating at the symbol rate of the incoming data and, typically, such an element, e.g. a microprocessor, can operate at speeds that are far higher than the symbol rate of the data.)

In the arrangement of FIG. 8, on the other hand, the codewords do not begin and end at the same time and, therefore, the codeword evaluations and corrections also do not need to occur concurrently. Specifically, in the FIG. 8 arrangement there are 13 cells from the end of one codeword to the end of the next codeword, and 5 cells from the time he last redundant symbol of a particular codeword arrives (e.g., the codeword in column 1 of the FIG. 8 matrix) and the first symbol of the next incarnation of that codeword arrives. Since it takes only 6 symbol periods to correct a codeword (with equipment used in the above example), it follows that one symbol of additional memory is required. Hence, the total memory required in the receiver for the FIG. 8 arrangement is 66 symbols. On the other hand, with a faster processor that requires only 5 symbol periods to correct a codeword, only 65 symbols of memory would be required— which is the minimum memory necessary. One can think of the memory requirement as ND, plus L-D, with the minimum being ND.

Figures 13, 16:
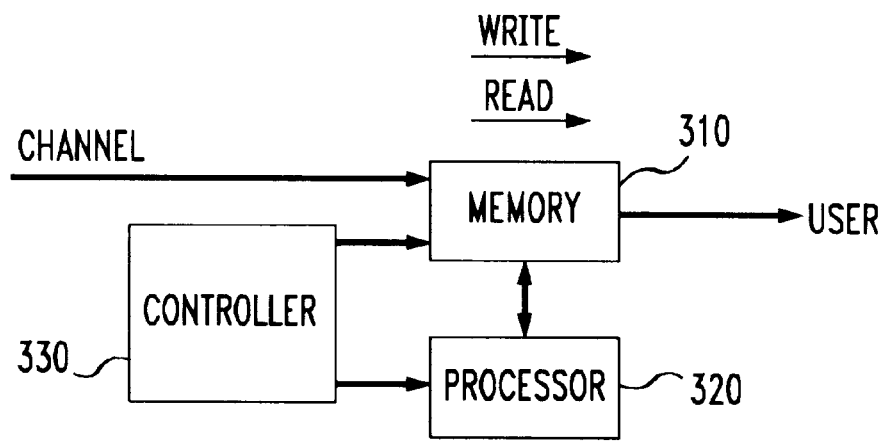
FIG. 13 is a block diagram of a receiver suitable for encoder arrangement of FIG. 10, and it is also a depiction of the most compact transmitter.
FIG. 16 illustrates random convolutional interleaving.

FIG. 13 presents a block diagram of still another embodiment that is adapted to the principles of this invention. Just as with the arrangement of FIG. 11, it can serve as an encoder (within a transmitter), or as a decoder (within a receiver). It includes a memory 310, a processor 320 coupled to memory 310 and a controller 330 coupled to memory 310 and processor 320. As depicted, memory 310 includes a number of data ports (input, output to user and output to processor 320) but in actuality, a single I/O port is time shared. When acting as a receiver, processor 320 reads data from memory 310 and analyzes that data. If correction of data symbols is called for, processor 320 writes data into memory 310.

Processor 320 carries out the processing necessary for detecting errors and for correcting errors. Some memory is needed to store temporary results of the error detection processes, and that memory may be included within controller 330 or be part of memory 310. A program store memory will, of course, provide the necessary storage area. That memory also holds the programs that control processor 320.

The error correction processing method that processor 320 carries out is not described here because it may be perfectly conventional and forms no part of this invention. Whatever coding schema is selected (be it Reed-Solomon, or other coding), the corresponding decoding must be applied by processor 320. What is unique in both the transmitter and the receiver arrangements is the utter flexibility to handle whatever implied interleaving is selected, and the simplicity of the attendant controls. Thus, for example, for the interleaving arrangement shown in FIG. 8 and the FIG. 13 arrangement used as a receiver, when the controller focus is on cell 1 (first row, first column) the following activities take place:

A1. memory 310 outputs the symbol stored for codeword 1 in cell 1 (which had already been corrected, if necessary) and delivers it to the user;

A2. the error detection temporary store for codeword 1 (in controller 330) is reset;

A3. the symbol arriving at the receiver is declared to be the first symbol of the next codeword 1 and is stored in cell 1;

A4. the error detection information in the temporary store for codeword 1 is updated with the information stored in cell 1; and A5. the error correction processing for codeword 2 is initiated.

When the controller focus is on cell 2, the following activities take place:

B1. memory 310 outputs the symbol stored for codeword 3 in cell 2 and delivers it to the user;

B2. the symbol arriving at the receiver is declared to be the next symbol of codeword 3 and it is stored in cell 2;

B3. the error detection information in the temporary store for codeword 3 is updated with the information stored in cell 2; and B4. the error correction processing for codeword 2 is continued.

By the time focus rests on cell 13, the error correction processing of codeword 2 is completed, allowing cell 14 to output the correct first symbol of codeword 2; whereupon process steps A1 through A5, above, can be executed.

Figure 14:
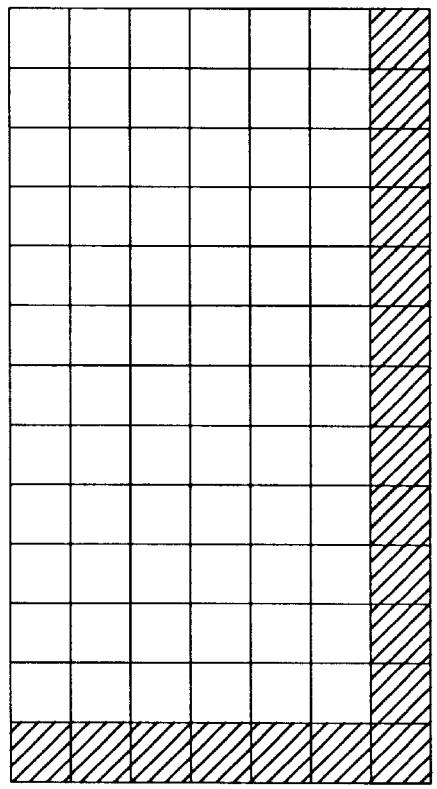
FIG. 14 presents a memory map for product encoding.
Figure 15:
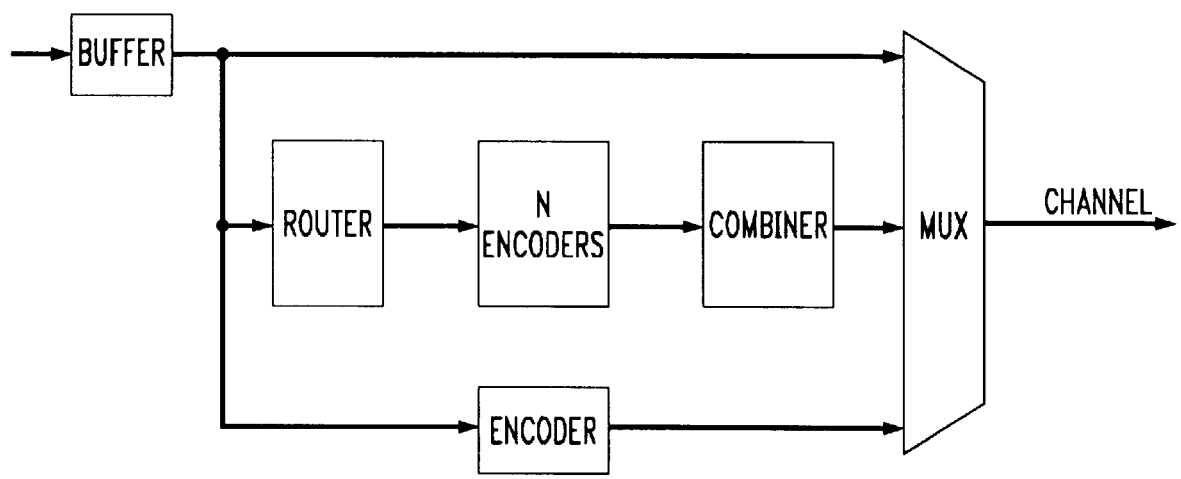
FIG. 15 is an encoder arrangement for the FIG. 14 product code.

To demonstrate the flexibility of the arrangement disclosed herein, an extension to product encoding is presented. By "product" what is meant is that the implied interleaving can be viewed to be two dimensional, as illustrated, for example, in FIG. 14 which includes an implied convolutional interleaving arrangement in accord with FIG. 8 (column-wise), with an implied block interleaving row-wise. Since those error correcting symbols follow the data as it arrived (where cells are filled a row at a time), the modification to the transmitter is merely one additional encoder in parallel with the encoder bank illustrated, for example, in FIG. 10. Specifically, as shown in FIG. 15, the transmitter includes an additional encoder 125 whose output is delivered to channel 10 under control of multiplexer 221. The FIG. 15 extension to the FIG. 10 arrangement is merely illustrative, of course. The other architectures, such as that of FIG. 13, are similarly extendible.

At the receiver, when focus is on the row error correcting symbol, the information is available to perform whatever procedure is necessary within processor 320. The erroneous symbol(s) in the row can then be corrected, or information about those symbols can be stored and taken into account when the codeword error correction process is executed. For example, with a single parity in each row, a single error in the row can be identified. That information can be communicated to each of the codeword correction procedures, and that information can simplify those procedures. For example, knowledge that an error exists in row 4 of FIG. 8 corresponds to knowledge that an error may exist in symbol 4 of codeword 1, in symbol 12 of codeword 3 (the first redundant symbol in codeword 3), in symbol 7 of codeword 5, in symbol 2 of codeword 2, or in symbol 10 of codeword 4.

The above discussion regarding convolutional interleaving depicted the conventional condition of regular convolutional interleaving where every $(D+1)^{th}$ symbol belongs to a particular codeword. That is not a requirement, however. Indeed, the encoder/decoder of, for example, FIG. 13 can handle a random arrangement that does not follow the above notion. FIG. 16 illustrates such an implied convolutional interleaving where every $(D+1)^{th}$ symbols does not necessarily belong to a particular codeword. In contradistinction to regular convolutional interleaving, this may be considered random convolutional interleaving. Even a higher level of "randomness" is acceptable in, for example, abandoning the notion of consecutive symbols are routed to different encoders. That, in fact, is not a requirement, and one can easily devise arrangements where all, or some, of the encoders have a pair of consecutive symbols routed to them. The maximum number of consecutive symbols is, of course, the number of symbols in a codeword, and that, obviously, is the limit (yielding a non-interleaved arrangement).

I claim:

1. An encoder comprising:

a memory; and processing means coupled to the memory including
  a) means for writing incoming symbols into the memory,
  b) means for outputting symbols out of the memory at rate higher than the rate of writing into the memory, and applying the read symbols to a channel,
  c) means for implementing D encoders (D being an integer) in the processing means cooperating with the memory, by employing the read symbols in calculations aimed at developing redundant symbols, where each set of D×K consecutive symbols are distributed to different ones of the implemented D encoders such that at least one pair of consecutive symbols are applied to a particular one of said D encoders, where K is the number of symbols in a codeword, exclusive of the redundant symbols.

2. An encoder comprising:

a memory; and processing means coupled to the memory including
  a) means for writing incoming symbols into the memory,
  b) means for outputting symbols out of the memory at rate higher than the rate of writing into the memory, and applying the read symbols to a channel, c) means for implementing D encoders (D being an integer) in the processing means cooperating with the memory, by employing the read symbols in calculations aimed at developing redundant symbols, where each set of D consecutive symbols are distributed to different ones of the implemented D encoders, and d) means for applying the redundant symbols to the channel, where the calculations for the D encoders are reset in accordance with a selected implied convolutional interleaving schema.

3. An encoder according to claim 2 where, under control of the processing means, in addition to each set of D consecutive symbols being distributed to different ones of the implemented D encoders, each $(D+1)^{th}$ symbol is employed in the calculations of a particular encoder.

4. An encoder according to claim 2 where, under control of the processing means, in addition to each set of D consecutive symbols being distributed to different ones of the implemented D encoders, at least one set that contains each $(D+1)^{th}$ symbol is employed in the calculations of more than one encoder.

5. An encoder according to claim 2 where incoming symbols are written into a data buffering region of the memory, symbols are read out of the data buffering region, and implementation of the D encoders involves storage of calculation results, which results are stored in another region of the memory.

6. The encoder of claim 2 where the reading out of symbols out of the memory is in the same order as symbols written into the memory.

7. The encoder of claim 2 further comprising means for block encoding said incoming signals.

8. The encoder of claim 7 wherein said block interleaving and said convolutional interleaving form a product encoding arrangement.

9. An encoder comprising: a memory; and processing means coupled to the memory for a) writing incoming symbols into the memory, b) outputting symbols out of the memory at a rate higher than the rate of writing into the memory, and applying the read symbols to a channel, c) implementing D encoders (D being an integer) by employing the read symbols in calculations aimed at developing redundant symbols, where each set of D consecutive symbols are distributed to different ones of the implemented D encoders and each Dth symbol is employed in the calculations of a particular encoder, and d) applying redundant symbols to the channel, where the calculations for the D encoders are reset in accordance with a selected implied interleaving approach from a set that includes regular convolutional implied interleaving and block implied interleaving.

10. An encoder according to claim 9 where the set of implied interleaving approaches includes random convolutional interleaving.

11. An implied interleaving encoder responsive to a stream of incoming data symbols that is assumed to comprise codewords having N symbols which include redundant symbols and which are interleaved in a convolutional interleaving pattern to an interleaving depth D, for developing the redundant symbols for each of the codewords and inserting them in the stream of incoming data symbols in accordance with the interleaving pattern, including a first memory for buffering symbols of the incoming data;

a plurality of D encoders, each of which develops a set of at least one redundant symbol corresponding to a sequence of symbols that define a data portion of a codeword;

a first router responsive to output data of the first memory for delivering successive symbols to different ones of the D encoders in a cyclic manner; and a combiner, responsive to the redundant symbols developed by the D encoders and to output data of the first memory, for applying information arriving at the combiner to a channel, where each of the D encoders is arranged to handle codewords that are offset from the codewords handled by the other encoders by at least two symbols.

12. An implied interleaving encoder responsive to a stream of incoming data symbols that is assumed to comprise codewords having N symbols which include redundant symbols and which are interleaved in a product interleaving pattern to an interleaving depth D, for developing the redundant symbols for each of the codewords and inserting them in the stream of incoming data symbols in accordance with the interleaving pattern, including a first memory for buffering symbols of the incoming data;

a plurality of D encoders, each of which develops a set of at least one redundant symbol corresponding to a sequence of symbols that define a data portion of a codeword;

an additional encoder responsive to all output data of the first memory for developing at least one additional redundant symbol for each set of preselected number of symbols delivered by the first memory;

a first router, responsive to output data of the first memory for delivering successive symbols to different ones of the D encoders in cyclic manner;

a combiner, responsive to the redundant symbols developed by the D encoders, to the redundant symbols developed by the additional encoder, and to output data of the first memory, for applying information arriving at the combiner to a channel.

13. The encoder of claim 12 where each of the D encoders are arranged to handle codewords that are offset from the codewords handled by the remaining ones of said D encoders by at least two symbols.

14. A systematic convolutional system comprising:

a plurality of encoders, where each of the encoders outputs the signals applied to the encoder, in the order the signals are applied to the encoder, as well as redundant signals that are developed from a preselected number of the input signals applied to the encoder following a reset signal applied to the encoder;

means for dispersing applied input signals to said plurality of encoders, where the applied input signals arrive at a predetermined rate;

means for combining the output signals of the plurality of encoders; and means for applying a reset signal to at least one of the encoders that is staggered from the other reset signals by more than one period of the rate of arrival of the applied input signals.

15. A method for encoding and interleaving an applied sequence of input signals arriving at regular intervals, the sequence having a given order, to develop an interleaved output signal comprising the input signals in a sequence having the same given order, the method comprising the steps of:

routing the input signals to a plurality of encoders;

in response to the input signals routed to the encoders, the encoders developing a selected number of redundant signals and outputting the redundant signals, where the inserting of redundant signals by any one of the encoders is staggered in time relative to any other one of the encoders by more than one of said intervals; and routing the output signals of the encoders to an output port.

16. An encoder comprising:

a memory; and processing means coupled to the memory including
  a) means for writing incoming symbols into the memory,
  b) means for outputting symbols out of the memory at rate higher than the rate of writing into the memory, and applying the read symbols to a channel,
  c) means for implementing D encoders (D being an integer) in the processing means cooperating with the memory, by employing the read symbols in calculations aimed at developing redundant symbols, where each set of D consecutive symbols are distributed to different ones of the implemented D encoders, and
  d) means for applying the redundant symbols to the channel, where the calculations for the D encoders are reset in accordance with a selected implied random interleaving schema.

17. An implied interleaving encoder for creating a data stream output having segments of data and segments of error correction information, comprising:

a buffer memory adapted to receive and delay a data input communicated at a first bit rate, the buffer memory outputting the data in segments at a second bit rate which is faster than the first bit rate;

an implied interleaving circuit electrically coupled to the buffer memory, the implied interleaving circuit being adapted to generate the segments of error correction information based on the segments of the data; and a multiplexing circuit electrically coupled to the buffer memory and the implied interleaving circuit, the multiplexing circuit being adapted to create the data stream by alternatively trasmitting the segments of data from the buffer memory and the segments of error correction information from the implied interleaving circuit into a single data communications channel, wherein the sequence of the data is unchanged.

18. The implied interleaving encoder of claim 17, wherein the implied interleaving circuit further comprises:

at least one encoder adapted to generate error correction data from a data input;

a router adapted to distribute the data in the data segments to the at least one encoder according to a predetermined interleaving scheme; and a combiner adapted to generate the segments of error correction information by collecting the error correction data generated by the at least one encoder.

19. The implied interleaving encoder of claim 18, wherein the predetermined interleaving scheme is convolutional interleaving.

20. The implied interleaving encoder of claim 19, wherein the predetermined interleaving scheme is block interleaving.

21. An implied interleaving encoder for creating a data stream output having segments of data and segments of error correction information, comprising:

a means for receiving and delaying a data input communicated at a first bit rate;

a means for transmitting the data in segments at a second bit rate, the second bit rate being greater than the first bit rate;

a means for generating segments of error correction information based on the segments of the data using a predetermined implied interleaving scheme; and a means for alternatively transmitting the segments of data and the segments of error correction information into a data communications channel, wherein the sequence of the data is unchanged.

22. The implied interleaving encoder of claim 21, wherein the means for generating segments of error correction information further comprises:

a plurality of encoders adapted to generate error correction data from a data input;

a router adapted to distribute the data in the data segments among the plurality of encoders according to a predetermined interleaving scheme; and a combiner adapted to generate the segments of error correction information by collecting the error correction data generated by the plurality of encoders.

23. The implied interleaving encoder of claim 22, wherein the predetermined interleaving scheme is block interleaving.

24. The implied interleaving encoder of claim 22, wherein the predetermined interleaving scheme is convolutional interleaving.

25. An method for creating a data stream output having segments of data and segments of error correction information using implied interleaving, comprising the steps of:

receiving and delaying a data input communicated at a first bit rate;

transmitting the data in segments at a second bit rate, the second bit rate being greater than the first bit rate;

generating segments of error correction information based on the segments of the data using a predetermined implied interleaving scheme; and alternatively transmitting the segments of data and the segments of error correction information into a data communications channel, wherein the sequence of the data is unchanged.

26. The method claim 25, wherein the step of generating segments of error correction information further comprises the steps of:

distributing the data in the data segments among a plurality of encoders according to a predetermined interleaving scheme;

generating error correction data from the distributed data; and generating the segments of error correction information by collecting the error correction data generated by the plurality of encoders.

* * * * *